(12) United States Patent
Pigott (10) Patent No.: US 9,329,208 B2
(45) Date of Patent: May 3, 2016

(54) NEGATIVE VOLTAGE MEASUREMENT (71) Applicant: John Pigott, Phoenix, AZ (US)

(72) Inventor: John Pigott, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 322 days.

(21) Appl. No.: 14/012,884

(22) Filed: Aug. 28, 2013

(65) Prior Publication Data

US 2015/0061637 A1  Mar. 5, 2015

(51) Int. Cl.
*G01R 19/00* (2006.01)

(52) U.S. Cl.
CPC ........ *G01R 19/0084* (2013.01); *G01R 19/0023* (2013.01); *G01R 19/0092* (2013.01)

(58) Field of Classification Search
CPC ........... G01R 19/0023; G01R 19/0084; G01R 19/0092
USPC ....................................... 324/76.11, 522, 713
See application file for complete search history.

(56) References Cited

U.S. PATENT DOCUMENTS

| | | | | |
|---|---|---|---|---|
| 4,647,798 A | * | 3/1987 | Crafts ................. | H03K 3/3565 326/121 |
| 4,794,278 A | * | 12/1988 | Vajdic .................... | G05F 3/205 327/309 |
| 6,229,296 B1 | | 5/2001 | Duesman et al. | |
| 6,549,016 B1 | * | 4/2003 | Curd ...................... | G11C 16/30 324/522 |
| 2008/0084232 A1 | | 4/2008 | Huang et al. | |
| 2008/0309320 A1 | * | 12/2008 | Chu .................. | G01R 19/16538 324/119 |
| 2010/0039166 A1 | * | 2/2010 | Choi ...................... | G11C 5/145 327/535 |

FOREIGN PATENT DOCUMENTS

EP  0570148 A2  11/1993

OTHER PUBLICATIONS

Siliconix Article "FETs as Voltage-Controlled Resistors," Mar. 10, 1997   http://s.eeweb.com/members/earl_albin/answers/1355009286-vcr.pdf.
Universal Voltage Monitors, Semiconductor Components Industries, LLC, Dec. 2008, retrieved from http://onsemi.com, Jan. 2014.
+3V Voltage Monitoring, Low-Cost μP Supervisory Circuits; Maxim Integrated Products 19-0099, Rev. 5, Apr. 2006, retrieved from www.maxim-ic.com, Jan. 2014.

* cited by examiner

*Primary Examiner* — Hoai-An D Nguyen (57) ABSTRACT

A method of measuring a negative voltage using a device including a first transistor and a second transistor is provided. The first transistor is coupled to the second transistor and the negative voltage is supplied to a gate of the second transistor. A plurality of voltages are provided to a source input of the device. For each voltage of the plurality of voltages, whether a first voltage across the first transistor is equivalent to a second voltage across the second transistor is determined, and, when the first voltage across the first transistor is equivalent to the second voltage across the second transistor, the negative voltage is determined by measuring a magnitude of a positive voltage of the device.

20 Claims, 5 Drawing Sheets

NEGATIVE VOLTAGE MEASUREMENT

FIELD OF USE

The present disclosure relates generally to devices for the measurement of a negative voltage, and more specifically, to a device providing high impedance negative voltage measurement.

BACKGROUND

In conventional integrated circuit (IC) design, it can be difficult to measure and/or monitor negative voltages. This problem is made worse as the magnitude of those negative voltages increases (e.g., less than −8 volts (V)). Existing measurement techniques generally use either large resistor dividers and/or additional IC pins to make the negative voltage available and directly observable by an external sensor. In the case of a resistor divider, though, low-power charge pumps are generally not able to provide sufficient current to drive a resistor divider. External pins require the capability to pass a negative voltage, which complicates the design of electro-static discharge (ESD) structures connected to the IC and require significant additional space within the IC.

In some cases, existing circuits use Zener diodes to provide a predetermined offset to a measurement of a negative voltage (enabling the negative voltage to be measured as a positive voltage with known offset using conventional techniques). However, in many cases, existing fabrication techniques, such as silicon metal oxide semiconductor techniques, cannot bias Zener diodes to a sufficient degree to measure negative voltages below −8 V. Additionally, the use of an offsetting Zener diode consumes energy from the voltage node being measured.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

The present disclosure relates generally to devices for the measurement of a negative voltage, and more specifically, to a circuit providing high impedance negative voltage measurement.

Example circuits disclosed herein utilize two similarly-sized transistors connected in series. One of the devices is connected to a known supply voltage, while the second device is connected to the voltage being measured. While varying the known supply voltage and comparing the voltage across each transistor, it is possible to detect when the voltages across each transistor satisfy a predetermined relationship. At that time, the value of the negative test voltage can be derived from the known supply voltage and/or positive circuit voltage measurements, as described below. Accordingly, the present device enables the measurement of a negative voltage without direct observation of that negative voltage.

Figure 1:
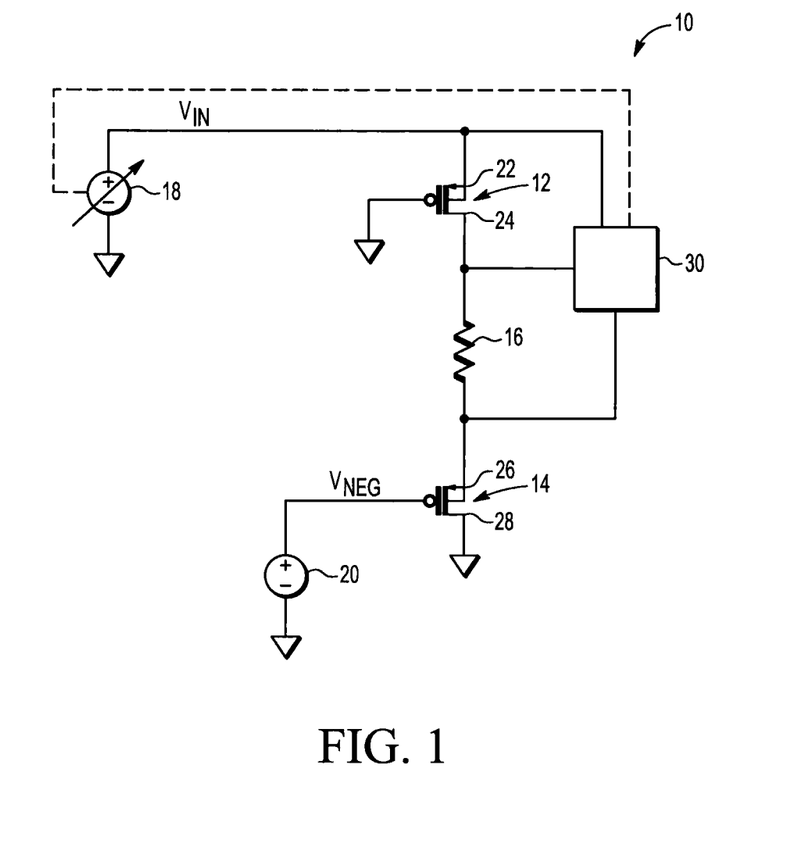
FIG. 1 is a circuit diagram of a device configured for performing high impedance negative voltage measurements according to one embodiment of the present invention.

FIG. 1 is a circuit diagram of device 10 configured for performing high impedance negative voltage measurements. Device 10 includes transistors 12 and 14. In one implementation, transistors 12 and 14 are p-type metal oxide semiconductor (PMOS) field effect transistors (FETs), though other field effect transistors, such as junction gate field effect transistors (JEFTs) may be utilized. Transistor 12 and 14 are of similar construction and so will have similar responses to similar inputs. Because the degree to which transistors 12 and 14 are identical affects the accuracy of the device, transistors 12 and 14 are configured so as to be sufficiently similar to meet desired device 10 accuracy requirements.

The drain of transistor 12 is connected to the source of transistor 14 through a resistance, labeled resistor 16 on FIG. 1. Resistor 16 may have any appropriate resistance depending upon the device configuration. Generally, the resistance of resistor 16 is selected to provide for a suitable current flow through transistors 12 and 14 in view of anticipated operating conditions. In an example device, for example, where the anticipated negative voltages being measured will be approximately −8 V, the resistance value of resistor 16 may be approximately 100 kilo ohms. In some cases, resistor 16 is implemented as a separate resistive device or component connected to both transistors 12 and 14. The resistor device may be part of the same IC in which transistor 12 and 14 or may be a formed separately from the transistor in a different circuit or as a separate device. Alternatively, resistor 16 may be replaced by any device or combination of devices configured to set an appropriate current flow through transistor 12 and 14. For example, resistor 16 could be replaced by one or more transistors configured to set a particular current flow or particular range of operating currents.

Controller 30 is connected to several nodes of circuit 10 as well as a ground voltage node (not shown) and is configured to measure a voltage at one or more of those nodes. Controller 30 may include circuitry formed within the same IC as the remainder of circuit 10 or may be formed as a separate circuit that is connected to the remainder of circuit 10. Controller 30 may include any combination or sensors or devices configured to measure and, in some cases, compare voltages measured from circuit 10. As such, controller 30 may include an external test instrument, such as a voltmeter, switched by other circuits inside the IC to the relevant nodes while the circuit is being monitored. Alternatively, controller 30 may include a purpose-built processor (e.g., an application specific integrated circuit). In some implementations, controller 30 may also be configured to control the output of voltage source 18 (indicated by the dashed control line). In that case, controller 30 may be configured to implement an algorithm to perform negative voltage measurement using circuit 10—for example, in accordance with the flowchart depicted in FIG. 2.

The source of transistor 12 is connected to voltage source 18. Voltage source 18 is variable and controllable, for example by controller 30, and can be swept through a range of voltages ($V_{IN}$). Generally, the range of voltages through which voltage source 18 may be swept is sufficiently large to enable measurements that cover the corresponding range of anticipated negative voltages to be measured. Generally, to measure a particular negative voltage, the value of $V_{IN}$ is equal to the positive value of that negative voltage plus the gate-source voltage of one of transistors 12 or 14. For example, in a device 10 where transistors 12 and 14 each have gate-source voltages of 2.6 V, if the negative voltage to be measured is anticipated to fall within the range of −7 V to −9 V, the range of voltages through which voltage source 18 is swept should be from 9.6 V to 11.6 V. The gate of transistor 12 is connected to ground. In one implementation the gate of transistor 12 is connected to a ground terminal which is, in turn, connected to a ground voltage.

The gate of transistor 14 is connected to voltage source 20, which represents the negative voltage ($V_{NEG}$) to be measured. The drain of transistor 14 is connected to ground. In one implementation the drain of transistor 14 is connected to a ground terminal which is, in turn, connected to a ground voltage.

During operation of device 10, the negative voltage being measured ($V_{NEG}$) is used to affect the drain-source saturation resistance ($R_{DS}$(on)) of transistor 14 by causing a voltage to appear between the gate and drain of transistor 14. At the same time, transistor 12 is biased with the positive supply voltage $V_{IN}$. The same current flows through both transistor 12 and transistor 14. Consequently, when the drain-source voltages ($V_{DS}$) of both transistors 12 and 14 are equal, both transistors 12 and 14 have the same gate to drain voltage. Additionally, each transistor has the same gate to source voltage. Based upon those attributes, the value $V_{NEG}$ can be derived from the value of $V_{IN}$ and/or positive circuit voltage measurements, as described below.

Figure 2:
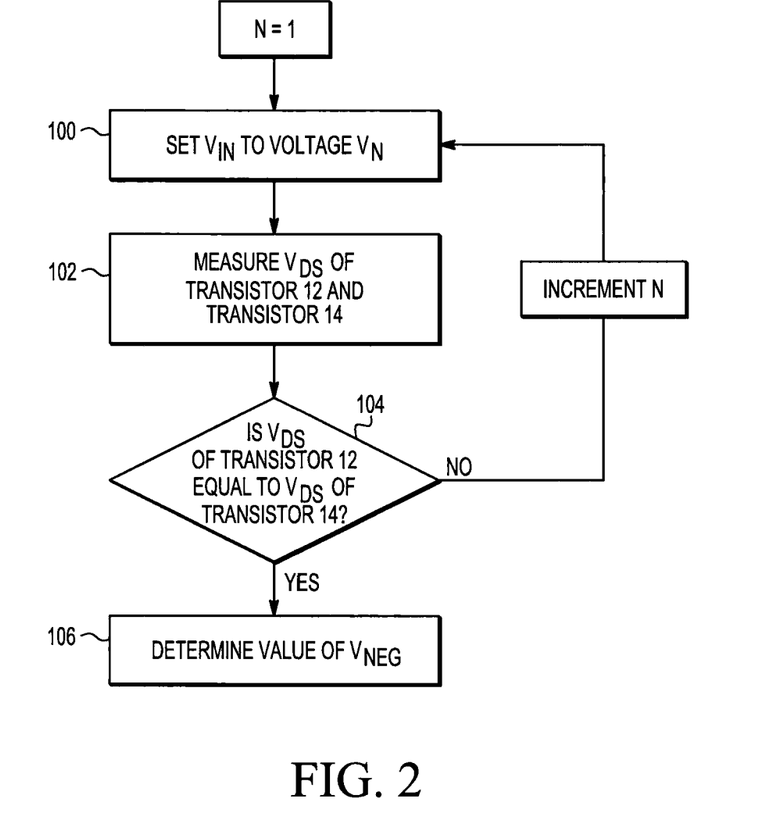
FIG. 2 is a flowchart illustrating a method for high impedance negative voltage measurement using the device of FIG. 1.
Figure 3A:
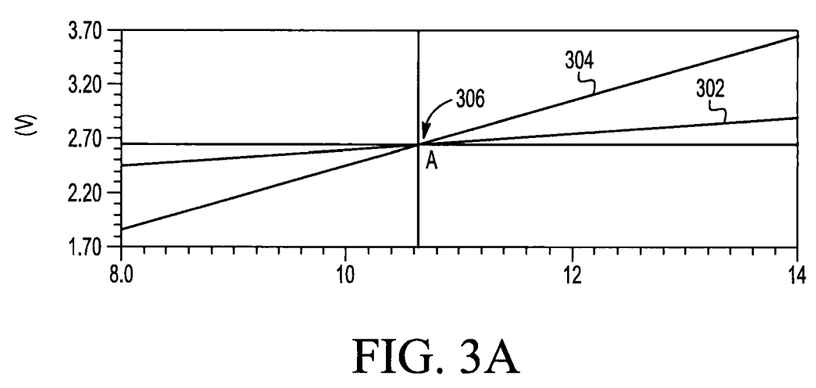
FIGS. 3A and 3B are graphs illustrating data generated during the execution of the method of FIG. 2.
Figure 3B:
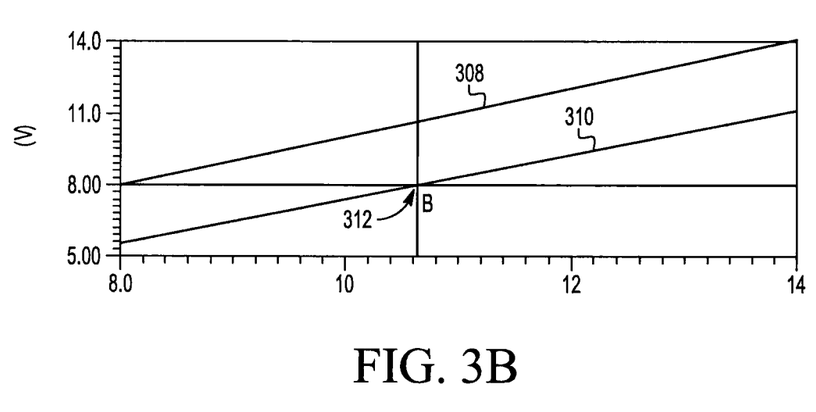

FIG. 2 is a flowchart illustrating a method for high impedance negative voltage measurement using the device of FIG. 1 that enables the value $V_{NEG}$ to be derived from the value of $V_{IN}$. The method may be performed, for example, by controller 30. Additionally, FIGS. 3A and 3B are graphs illustrating data captured during the execution of the method of FIG. 2. In both FIGS. 3A and 3B, the vertical axis represents voltage, while the horizontal axis is dimensionless. In FIG. 3A, the vertical axis ranges from 1.70 V to 3.7V, while in FIG. 3B the vertical axis ranges from 5.00 V to 14.0 V. The data in FIGS. 3A and 3B are collected at the same time, with data points that occupy the same position on the horizontal axis being captured simultaneously.

When performing the method, the voltage source $V_{IN}$ is swept (e.g., by controller 30) through a range of values indicated by $V_N$ (illustrated by line 308 on FIG. 3B). In one example, $V_{IN}$ is swept from 8 V to 14 V. In general, when sweeping the voltage of $V_{IN}$, the incremental step changes in $V_{IN}$ are selected to be smaller than the desired resolution of the overall device. Accordingly, if the device is to have an accuracy of 0.1 V, the step changes in $V_{IN}$ may be 0.05 V. In one implementation, the step changes in $V_{IN}$ are 1/10 of the overall accuracy of the device. In other implementations, the variation in the voltage $V_{IN}$ may be continuous, with no step changes being made.

Accordingly, with the value of N set to 1, in step 100, $V_{IN}$ is set to a voltage of $V_1$. Then, with $V_{IN}$ set, in step 102 the $V_{DS}$ values of both transistors 12 and 14 are measured. $V_{DS}$ for transistor 12 is measured across nodes 22 and 24 shown in FIG. 1 (e.g., by controller 30). $V_{DS}$ for transistor 14 is measured across nodes 26 and 28 of FIG. 1 (e.g., by controller 30). In FIG. 3A, line 302 represents the $V_{DS}$ of transistor 12 and line 304 represents the $V_{DS}$ of transistor 14 while $V_{IN}$ is being swept.

In step 104, the two $V_{DS}$ values are compared, for example, by controller 30, and, if the measured $V_{DS}$ of transistor 12 is equal to the measured $V_{DS}$ of transistor 14 (see point 306 on FIG. 3A), the value of $V_{NEG}$ is determined in step 106. In one implementation, if the measured voltages are within a particular threshold voltage (e.g., 0.05 V) the two values will be considered equal. Alternatively, when $V_{IN}$ is being ramped up from a small value to a larger value, step 104 may involve determining whether the $V_{DS}$ of transistor 12 is equal to or greater than the $V_{DS}$ of transistor 14. When the $V_{DS}$s of transistors 12 and 14 are equal, $V_{NEG}$ is equal to the negative of the voltage at node 24 of device 10 (see FIG. 1) at that time. Alternatively, when $V_{DS}$ of transistor 12 is equal to $V_{DS}$ of transistor 14, $V_{NEG}$ is also equal to the negative value of the result of $V_{IN}$ at that time minus the voltage across transistor 14). Accordingly, $V_{NEG}$ is equal to the negative of $V_{IN}$ at that time minus the voltage at node 26 (see FIG. 1).

In FIG. 3B, line 310 shows the voltage at node 24 of FIG. 1 as $V_{IN}$ is swept. Accordingly, the negative value of the voltage at point 312 (corresponding to the $V_{IN}$ value at which the $V_{DS}$s of transistors 12 and 14 were equal) is equal to the $V_{NEG}$ being measured.

If, however, in step 104 it is determined that the $V_{DS}$s of transistors 12 and 14 are not equal, the value of N is incremented, and in step 100 $V_{IN}$ is set to a new voltage and the test is again performed. In this manner, $V_{IN}$ will be swept through a range of values until a value of $V_{IN}$ is determined that results in the $V_{DS}$s of transistors 12 and 14 being equal. At that time, the value of $V_{NEG}$ being tested can be derived from the value of $V_{IN}$.

In the method of FIG. 2, the various voltages being measured (e.g., $V_{IN}$, and the voltages at nodes 24 and 26 of the device of FIG. 1) can be measured using conventional techniques and devices. This is possible because those voltages are all positive values and the measurement of positive values does not present the same difficulties as those for negative values. Accordingly, using device 100 and the method of FIG. 2, it is possible to derive the value of the $V_{NEG}$ input by measuring and analyzing only positive voltages. For instance, these voltages could be measured directly by an external test instrument, such as a voltmeter, switched by other circuits inside the IC to these nodes while the circuit is being monitored.

In other implementations of the method of FIG. 2, rather than sweep the voltage $V_{IN}$ in a positive direction, $V_{IN}$ may initially be set to a high value. $V_{IN}$ can then be decremented though a range of values until it is determined that the $V_{DS}$s of transistors 12 and 14 are equal (or that the $V_{DS}$ of transistor 14 is greater than or equal to the $V_{DS}$ of transistor 12), at which time the value of $V_{NEG}$ can be determined.

Figure 4:
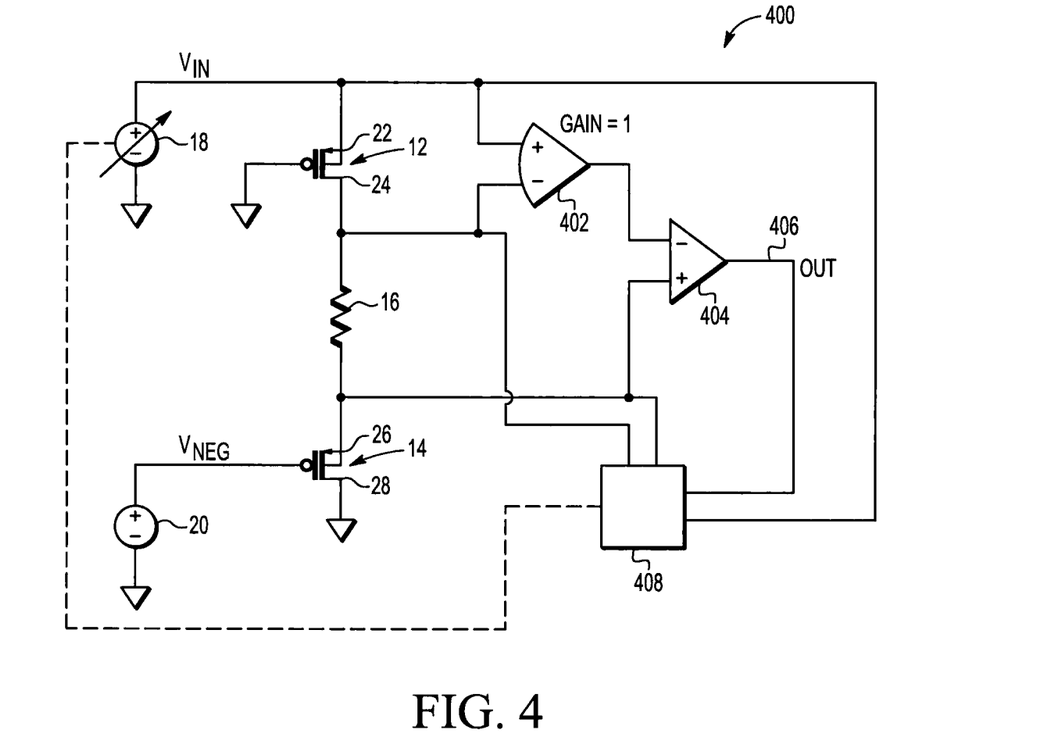
FIG. 4 is a circuit diagram showing a second implementation of the device of FIG. 1.

FIG. 4 is a circuit diagram showing a second implementation of the device of FIG. 1. Device or circuit 400 includes the components of device 10 (shown in FIG. 1), with additional components configured to perform the comparisons called for by the method described in FIG. 2. Accordingly, in FIG. 4 device 400 includes transistors 12 and 14. Transistor 12 and 14 are of similar construction and so will have similar responses to similar inputs. Because the degree to which transistors 12 and 14 are identical affects the accuracy of the device, transistors 12 and 14 are configured so as to be sufficiently similar to meet desired device 400 accuracy requirements.

The drain of transistor 12 is connected to the source of transistor 14 through a resistance, labeled resistor 16. Generally, the resistance of resistor 16 is selected to provide for a suitable current flow through transistors 12 and 14. The source of transistor 12 is connected to voltage source 18. Voltage source 18 is controllable and can be swept through a range of voltages ($V_{IN}$). Generally, the range of voltages through which voltage source 18 may be swept is sufficiently large to enable measurements that cover the corresponding range of anticipated negative voltages to be measured.

The gate of transistor 14 is connected to voltage source 20, which represents the negative voltage ($V_{NEG}$) to be measured. The drain of transistor 14 is connected to ground.

Device 400 includes differential amplifier 402 with a positive input connected to node 22 and a negative input connected to node 24. Differential amplifier 402 is configured with a gain of 1 and so generates an output equal to the voltage difference between nodes 22 and 24 (i.e., $V_{DS}$) of transistor 12. The output of differential amplifier 402 is supplied to a negative input of comparator 404. A positive input of comparator 404 is connected to node 26 (i.e., $V_{DS}$) of transistor 14. Accordingly, comparator 404 is configured to compare the $V_{DS}$s of transistors 12 and 14.

During operation of device 400, therefore, when the output 406 of comparator 404 goes to zero, that condition indicates that the $V_{DS}$ of transistor 12 is equal to the $V_{DS}$ of transistor 14. At that time, the value of $V_{NEG}$ is equal to the negative of the voltage at node 24 of device 400 or, alternatively, when $V_{DS}$ of transistor 12 is equal to $V_{DS}$ of transistor 14, $V_{NEG}$ is equal to the negative of $V_{IN}$ minus the voltage at node 26. In one implementation, as depicted, controller 408 is connected to several nodes of circuit 400 and is configured to measure a voltage at one or more of those nodes. Controller 408 may also be connected to voltage source 18 to control the voltage $V_{IN}$. Controller 408 is also connected to voltage source 18 and is configured to control the voltage generated by source 18.

Controller 408 may include circuitry formed within the same IC as the remainder of circuit 400 or may be formed as a separate circuit that is connected to the remainder of circuit 400. Controller 408 may include any combination or sensors or devices configured to measure and, in some cases, compare voltages measured from circuit 400.

Controller 408 may be configured to measure the voltage at output 406. When that voltage goes to zero (indicating that the $V_{DS}$ of transistor 12 is equal to the $V_{DS}$ of transistor 14), controller 408 may be configured to determine the voltage of $V_{NEG}$. For example, controller 408 may determine the value of $V_{NEG}$ by measuring the voltage at node 24 of device 400 (and taking that voltage's negative) or, alternatively, by determining the negative value of the difference between $V_{IN}$ and the voltage at node 26.

In an alternative implementation, though, the output of comparator 404 is used to directly control the output of voltage source 18. Comparator 404 compares the voltage across transistor 12 (which is converted to a ground-referenced signal by differential amplifier 402) with the voltage across transistor 14. When the voltage across transistor 12 is greater than the voltage across transistor 14, the negative input to comparator 404 is below the positive input and the output of comparator 404 will be driven high. This high output can then be supplied to voltage source 18 ($V_{IN}$) causing the voltage outputted by voltage source 18 to increase, in turn causing the voltage across transistor 12 to decrease. Conversely, when the voltage across transistor 12 is less than the voltage across transistor 14, the negative input to comparator 404 is above the positive input and the output of comparator 404 will be driven low. This low output can then be supplied to voltage source 18 ($V_{IN}$) causing the voltage outputted by voltage source 18 to decrease, in turn causing the voltage across transistor 12 to increase. The circuit reaches a balance point where the voltage across transistor 12 is equal to the voltage across transistor 14. At that time, the voltage $V_{NEG}$ can be determined, as described herein.

Figure 5:
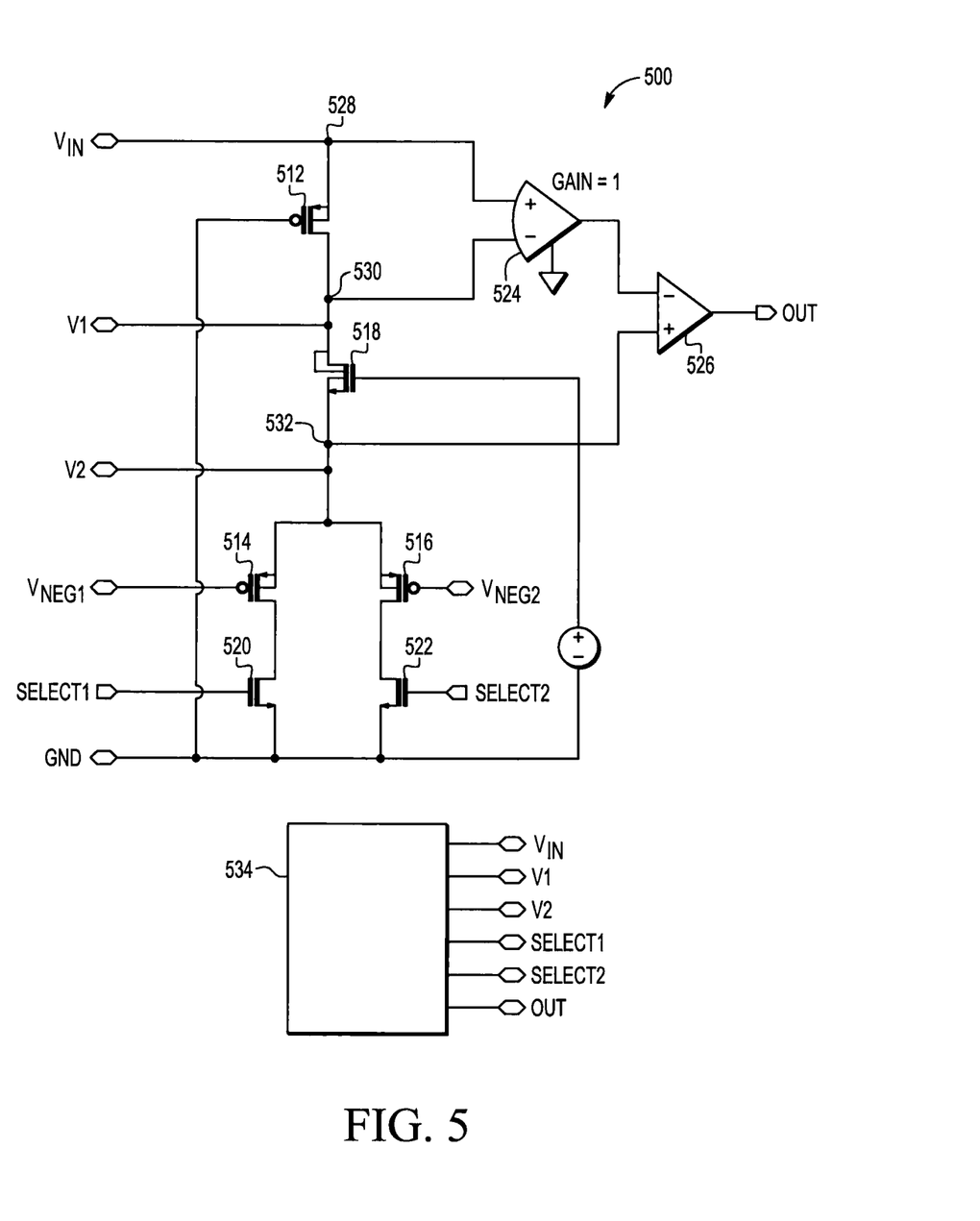
FIG. 5 is a circuit diagram showing an alternative device configured for performing high impedance negative voltage measurement according to another embodiment of the present invention.

FIG. 5 is a circuit diagram showing an alternative device configured for performing high impedance negative voltage measurement. Device or circuit 500 includes two stages configured to measure two different negative voltages, though other devices may be constructed including any number of stages.

Device 500 includes transistors 512, 514, and 516. In one implementation, transistors 512, 514, and 516 are p-type metal oxide semiconductor (PMOS) field effect transistors (FETs). Transistor 512, 514, and 516 are of similar construction and so will have similar responses to similar inputs. Because the degree to which transistors 512, 514, and 516 are identical affects the accuracy of the device, transistors 512, 514, and 516 are configured so as to be sufficiently similar to meet desired device 500 accuracy requirements.

The drain of transistor 512 is connected to the sources of transistors 514 and 516 through a resistance, in this case provided by transistor 518. Transistor 518 is configured to provide for a suitable current flow through transistors 512, 514, and 516 in view of anticipated operating conditions. This is achieved by connecting the gate of transistor 518 to a suitable voltage.

The source of transistor 512 is connected to a voltage source $V_{IN}$. $V_{IN}$ can be swept through a range of voltages. Generally, the range of voltages is sufficiently large to enable measurements that cover the corresponding range of anticipated negative voltages to be measured. The gate of transistor 12 is connected to ground.

The gate of transistor 514 is connected to a first negative voltage ($V_{NEG1}$) to be measured and the gate of transistor 516 is connected to a second negative voltage ($V_{NEG2}$) to be measured.

The drain of transistor 514 is connected to ground through transistor 520 and the drain of transistor 516 is connected to ground through transistor 522. The gate of transistor 520 is connected to a first select input (SELECT1) and the gate of transistor 522 is connected to a second select input (SELECT2). Accordingly, by selectively setting either SELECT1 or SELECT2 to a high value, either transistor 520 or transistor 522 can be put into a conductive mode.

Device 500 includes differential amplifier 524 with a positive input connected to node 528 and a negative input connected to node 530. Differential amplifier 524 is configured with a gain of 1 and so generates an output equal to the voltage difference between nodes 528 and 530 (i.e., $V_{DS}$) of transistor 512. The output of differential amplifier 524 is supplied to a negative input of comparator 526. A positive input of comparator 526 is connected to node 532 (i.e., $V_{DS}$) of transistors 514 and 516.

Accordingly, depending upon the values of the inputs SELECT1 and SELECT2, comparator 526 is configured to compare the $V_{DS}$s of transistors 512 and either transistors 514 or 516. For example, when SELECT1 is high and SELECT2 is low, transistor 520 is turned on and transistor 522 is turned off. In that case, comparator 526 is configured to compare the $V_{DS}$s of transistors 512 and 514. Conversely, when SELECT1 is low and SELECT2 is high, transistor 520 is turned off and transistor 522 is turned on. In that case, comparator 526 is configured to compare the $V_{DS}$s of transistors 512 and 516.

Controller 534 is connected to several nodes of circuit 500. Controller 534 may include circuitry formed within the same IC as the remainder of circuit 500 or may be formed as a separate circuit that is connected to the remainder of circuit 500. Controller 534 may include any combination or sensors or devices configured to measure and, in some cases, compare voltages measured from circuit 500. As illustrated, controller 534 is configured to supply input voltage $V_{IN}$ to circuit 500, measure voltages $V_1$ and $V_2$ of nodes 530 and 532, respectively, and output OUT, and supply inputs SELECT1 and SELECT 2.

During operation of device 500, therefore, by setting either SELECT1 or SELECT2 to a high value, the value of either VNEG1 or VNEG2 can be measured, for example, by controller 534, pursuant to the methods described herein.

For example, to measure the value of VNEG1, controller 534 first sets SELECT1 to a high value and SELECT2 to a low value (this turns on transistor 520 and turns off transistor 522). Then, controller 534 sweeps $V_{IN}$ through a range of values. When the output of comparator 526 goes to zero (measured by controller 534 at node OUT), that indicates that the $V_{DS}$ of transistor 512 is equal to the $V_{DS}$ of transistor 514. At that time, the value of $V_{NEG1}$ is equal to the negative of the voltage at node 530 of device 500 or, alternatively, the negative of $V_{IN}$ minus the voltage at node 532. Accordingly, controller 534 can determine the value of $V_{NEG1}$ by measuring the voltage V1 (and taking that voltage's negative), or taking the negative of the voltage $V_{IN}$ minus the voltage V2. Note that when $V_{NEG1}$ is determined using the voltage V1, controller 534 may not be connected to V2 and, thereby, node 532 of circuit 500. Conversely, when $V_{NEG1}$ is determined using the voltage V2, controller 534 may not be connected to V1 and, thereby, node 530 of circuit 500.

To measure the value of $V_{NEG2}$, SELECT2 is first set to a high value and SELECT1 is set to a low value (this turns off transistor 520 and turns on transistor 522). Then, $V_{IN}$ can be swept through a range of values. When the output of comparator 526 goes to zero, that indicates that the $V_{DS}$ of transistor 512 is equal to the $V_{DS}$ of transistor 516. At that time, the value of $V_{NEG2}$ is equal to the negative of the voltage at node 530 of device 500 or, alternatively, the negative of $V_{IN}$ minus the voltage at node 532. Accordingly, controller 534 can determine the value of $V_{NEG2}$ by measuring the voltage V1 (and taking that voltage's negative), or taking the negative of the voltage $V_{IN}$ minus the voltage V2.

In this manner, a single device can be used to measure multiple negative voltage values. Based upon the circuit design illustrated in FIG. 5, it would be possible to add additional stages to the device in parallel to transistors 516 and 522 with corresponding inputs (e.g., SELECTN and VNEGN) allowing additional negative voltages to be measured by device 500.

In one implementation, the present disclosure provides a method of measuring a negative voltage using a device including a first transistor and a second transistor. The first transistor is coupled to the second transistor and the negative voltage is supplied to a gate of the second transistor. The method includes setting a voltage of a source of the first transistor to a first supply voltage, and, when the voltage of the source of the first transistor is set to the first supply voltage and a current through the first transistor is equivalent to a current through the second transistor, comparing a first source-drain voltage of the first transistor to a second source-drain voltage of the second transistor. The method includes when the voltage of the source of the first transistor is set to the first supply voltage and the first source-drain voltage of the first transistor is equivalent to the second source-drain voltage of the second transistor and the current through the first transistor is equivalent to the current through the second transistor, determining a value of the negative voltage by determining a voltage of a node of the device.

In another implementation, the present disclosure provides a method of measuring a negative voltage using a device including a first transistor and a second transistor. The first transistor is coupled to the second transistor and the negative voltage is supplied to a gate of the second transistor. The method includes providing a plurality of voltages to a source input of the device, and, for each voltage of the plurality of voltages, determining whether a first voltage across the first transistor is equivalent to a second voltage across the second transistor, and, when the first voltage across the first transistor is equivalent to the second voltage across the second transistor, determining the negative voltage by measuring a magnitude of a positive voltage of the device.

In another implementation, the present disclosure provides a device including a first transistor. The first transistor includes a gate connected to a ground voltage terminal, a source configured to connect to a variable voltage source, and a drain connected to a first terminal of a resistance. The device includes a second transistor. The second transistor includes a gate configured to connect to a negative voltage, a source connected to a second terminal of the resistance, and a drain connected to the ground voltage terminal. When the ground voltage terminal is connected to a ground voltage and a first source-drain voltage of the first transistor is equivalent to a second source-drain voltage of the second transistor, a magnitude of a voltage of the drain of the first transistor is equivalent to a magnitude of the negative voltage.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. A method of measuring a negative voltage using a device including a first transistor and a second transistor, the first transistor being coupled to the second transistor and the negative voltage being supplied to a gate of the second transistor, the method comprising:
setting a voltage of a source of the first transistor to a first supply voltage;
when the voltage of the source of the first transistor is set to the first supply voltage and a current through the first transistor is equivalent to a current through the second transistor, comparing a first source-drain voltage of the first transistor to a second source-drain voltage of the second transistor; and
when the voltage of the source of the first transistor is set to the first supply voltage and the first source-drain voltage of the first transistor is equivalent to the second source-drain voltage of the second transistor and the current through the first transistor is equivalent to the current through the second transistor, determining a magnitude of the negative voltage by determining a positive voltage of a node of the device.

2. The method of claim 1, wherein determining the voltage of the node of the device includes measuring a voltage of a drain of the first transistor.

3. The method of claim 1, wherein determining the voltage of the node of the device includes measuring a voltage of a source of the second transistor.

4. The method of claim 3, wherein determining the voltage of the node of the device includes subtracting the voltage of the source of the second transistor from the first supply voltage.

5. The method of claim 1, wherein a gate of the first transistor is coupled to a ground voltage terminal.

6. The method of claim 1, including, when the voltage of the source of the first transistor is set to the first supply voltage and the first source-drain voltage of the first transistor is not equivalent to the second source-drain voltage of the second transistor:
setting the voltage of the source of the first transistor to a second supply voltage, the second supply voltage being different from the first supply voltage; and
when the voltage of the source of the first transistor is set to the second supply voltage, comparing a first source-drain voltage of the first transistor to a second source-drain voltage of the second transistor.

7. The method of claim 6, including sweeping the voltage of the source of the first transistor through a range of voltage values.

8. The method of claim 1, wherein the first source-drain voltage of the first transistor is equivalent to the second source-drain voltage of the second transistor when a difference between the first source-drain voltage of the first transistor and the second source-drain voltage of the second transistor is within a predetermined threshold.

9. A method of measuring a negative voltage using a device including a first transistor and a second transistor, the first transistor being coupled to the second transistor and the negative voltage being supplied to a gate of the second transistor, the method comprising:
providing a plurality of different voltages to an input of the device;
for each voltage of the plurality of different voltages, determining whether a first voltage across the first transistor is equivalent to a second voltage across the second transistor; and
when the first voltage across the first transistor is equivalent to the second voltage across the second transistor, determining a magnitude of the negative voltage by measuring a magnitude of a positive voltage of the device.

10. The method of claim 9, wherein a gate of the first transistor is coupled to a ground voltage terminal.

11. The method of claim 9, wherein the input is connected to a source of the first transistor.

12. A device, comprising:
a resistance;
a first transistor, the first transistor including:
a gate connected to a ground voltage terminal,
a source configured to connect to a variable voltage source, and
a drain connected to a first terminal of the resistance;
a second transistor, the second transistor including:
a gate configured to connect to a negative voltage,
a source connected to a second terminal of the resistance, and
a drain connected to the ground voltage terminal; and
wherein, when the ground voltage terminal is connected to a ground voltage and a first source-drain voltage of the first transistor is equivalent to a second source-drain voltage of the second transistor, a magnitude of a voltage of the drain of the first transistor is equivalent to a magnitude of the negative voltage.

13. The device of claim 12, wherein the resistance includes a resistor.

14. The device of claim 13, wherein a resistance of the resistor is 100 kilo ohms.

15. The device of claim 12, wherein the resistance includes a third transistor, wherein a gate of the third transistor is configured to connect to a constant voltage.

16. The device of claim 12, wherein the first transistor and the second transistor are p-type metal oxide semiconductor (PMOS) field effect transistors (FETs).

17. The device of claim 12, including a differential amplifier, the differential amplifier including:
a first input connected to the source of the first transistor; and
a second input connected to the drain of the first transistor.

18. The device of claim 17, including a comparator, the comparator including:
a first input connected to an output of the differential amplifier; and
a second input connected to the source of the second transistor.

19. The device of claim 12, wherein the negative voltage is between −9 volts and −7 volts.

20. The device of claim 12, including:
- a fourth transistor, a source of the fourth transistor being connected to the source of the second transistor and a gate of the fourth transistor set to a second negative voltage; and
- an input configured to enable selective measurement of either the negative voltage of the second negative voltage.

* * * * *